(12) United States Patent  (10) Patent No.: US 8,817,451 B2
Kim et al.  (45) Date of Patent: Aug. 26, 2014

(54) SEMICONDUCTOR DEVICES AND METHODS OF MANUFACTURE THEREOF

(71) Applicants: Infineon Technologies AG, Neubiberg (DE); Samsung Electronic Co., Ltd., Suwon-si (KR)

(72) Inventors: Sun-Oo Kim, Hopewell Junction, NY (US); Yoon-Hae Kim, Sungnam (KR)

(73) Assignees: Samsung Electronics Co., Ltd., Sungnam (KR); Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/941,308

(22) Filed: Jul. 12, 2013

(65) Prior Publication Data

US 2013/0301187 A1 Nov. 14, 2013

Related U.S. Application Data

(63) Continuation of application No. 11/849,539, filed on Sep. 4, 2007.

(51) Int. Cl.
*H01G 4/005* (2006.01)

(52) U.S. Cl.
USPC .................................. 361/303; 257/532

(58) Field of Classification Search
CPC .............................. H01G 4/005; H01I 23/5223
USPC ................................................... 257/306, 307
See application file for complete search history.

(56) References Cited

U.S. PATENT DOCUMENTS

| 6,297,524 | B1 | 10/2001 | Vathulya et al. |
| 6,653,681 | B2 * | 11/2003 | Appel .......................... 257/307 |
| 7,009,832 | B1 * | 3/2006 | Chen et al. ................. 361/306.1 |
| 2006/0202250 | A1 * | 9/2006 | Hecht et al. .................. 257/306 |

FOREIGN PATENT DOCUMENTS

EP 0788164 A1 8/1997

* cited by examiner

*Primary Examiner* — Marcos D. Pizarro
*Assistant Examiner* — Sue Tang
(74) *Attorney, Agent, or Firm* — Slater & Matsil, L.L.P.

(57) ABSTRACT

Semiconductor devices and methods of manufacture thereof are disclosed. In a preferred embodiment, a capacitor plate includes a first propeller-shaped portion and a second propeller-shaped portion. A via portion is disposed between the first propeller-shaped portion and the second propeller-shaped portion.

19 Claims, 5 Drawing Sheets

SEMICONDUCTOR DEVICES AND METHODS OF MANUFACTURE THEREOF

This application is a continuation of patent application Ser. No. 11/849,539, entitled "Semiconductor Devices and Methods of Manufacture Thereof," filed on Sep. 4, 2007, which application is incorporated herein by reference.

TECHNICAL FIELD

The present invention relates generally to the fabrication of semiconductor devices, and more particularly to the fabrication of capacitors in integrated circuits.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Capacitors are elements that are used extensively in semiconductor devices for storing an electrical charge. Capacitors essentially comprise two conductive plates separated by an insulating material. When an electric current is applied to a capacitor, electric charges of equal magnitude yet opposite polarity build up on the capacitor plates. The capacitance, or the amount of charge held by the capacitor per applied voltage, depends on a number of parameters, such as the area of the plates, the distance between the plates, and the dielectric constant value of the insulating material between the plates, as examples. Capacitors are used in applications such as electronic filters, analog-to-digital converters, memory devices, control applications, and many other types of semiconductor device applications.

What are needed in the art are improved methods of fabricating capacitors in semiconductor devices and structures thereof.

SUMMARY OF THE INVENTION

Technical advantages are generally achieved by preferred embodiments of the present invention, which provide novel methods of manufacturing capacitor plates, capacitors, semiconductor devices, and structures thereof.

In accordance with a preferred embodiment of the present invention, a capacitor plate includes a first propeller-shaped portion, a second propeller-shaped portion, and a via portion disposed between the first propeller-shaped portion and the second propeller-shaped portion.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in specific contexts, namely implemented in CMOS device applications. Embodiments of the invention may also be implemented in other semiconductor applications such as memory devices, logic devices, power devices, and other applications that utilize capacitors, for example.

Some properties of capacitors are a function of size. A larger amount of energy or voltage may be stored by a capacitor the larger the capacitor plates are, for example. In some semiconductor device applications, it is desirable to increase the capacitance of capacitors, but the real estate of the chip is limited. Thus, what are needed in the art are improved methods of manufacturing capacitors and structures thereof that make efficient use of area of the integrated circuit.

These and other problems are generally solved or circumvented, and technical advantages are generally achieved, by preferred embodiments of the present invention, which comprise novel capacitor structures that are formed in multiple conductive layers of semiconductor devices. The capacitor plates of the capacitors have a novel shape, comprising a plurality of propeller-shaped portions that are connected together by via portions, to be described further herein.

Figure 1:
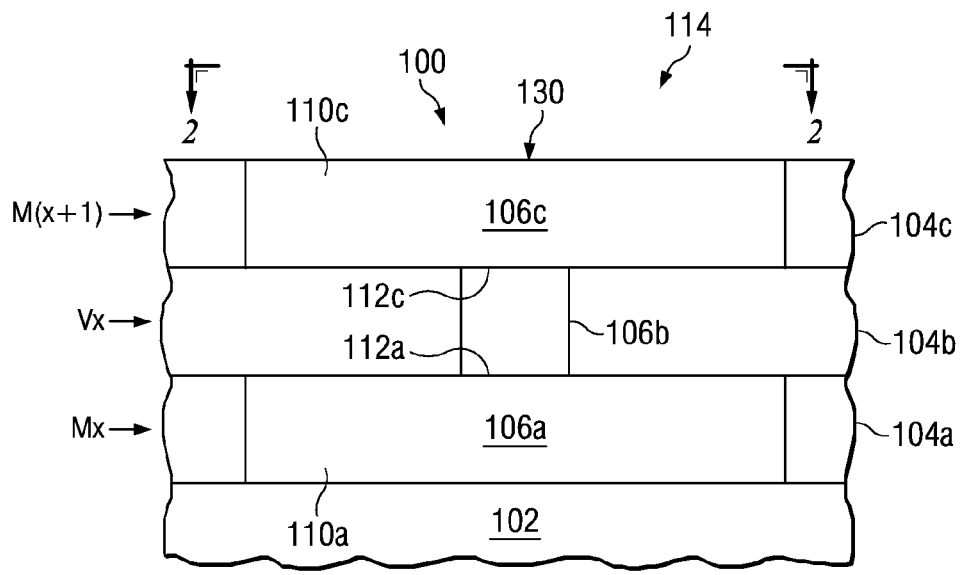
FIG. 1 shows a cross-sectional view of a semiconductor device in accordance with a preferred embodiment of the present invention, wherein a capacitor plate including propeller-shaped portions is formed in a plurality of conductive material layers of the semiconductor device.

FIG. 1 shows a cross-sectional view of a semiconductor device 100 in accordance with a preferred embodiment of the present invention, wherein a capacitor plate 114 (and also capacitor plate 116, shown in FIG. 2) of a capacitor 130 is formed in a plurality of conductive layers Mx, Vx, and M(x+1) of the semiconductor device 100. To manufacture the semiconductor device 100, first, a workpiece 102 is provided. The workpiece 102 may include a semiconductor substrate comprising silicon or other semiconductor materials and may be covered by an insulating layer, for example. The workpiece 102 may also include other active components or circuits formed within and/or over the workpiece 102, not shown. The workpiece 102 may comprise silicon oxide over single-crystal silicon, for example. The workpiece 102 may include other conductive layers or other semiconductor elements, e.g., transistors, diodes, etc., not shown. Compound semiconductors, GaAs, InP, Si/Ge, or SiC, as examples, may be used in place of silicon. The workpiece 102 may comprise a silicon-on-insulator (SOI) or a SiGe-on-insulator substrate, as examples.

An insulating material 104a comprising a dielectric material is deposited over the workpiece 102. The insulating material 104a is also referred to herein as a first insulating material 104a, for example. The first insulating material 104a preferably comprises about 1,000 to 4,000 Angstroms, or about 5,000 Angstroms or less, of an oxide such as $SiO_2$, a nitride such as $Si_3N_4$, a high-k dielectric material having a dielectric constant greater than about 3.9, a low-k dielectric material having a dielectric constant less than about 3.9, a capping layer, a hybrid inter-level dielectric (ILD), or combinations and multiple layers thereof, as examples. Alternatively, the first insulating material 104a may comprise other dimensions and materials, for example. The first insulating material 104a may be formed using chemical vapor deposition (CVD), atomic layer deposition (ALD), metal organic chemical vapor deposition (MOCVD), physical vapor deposition (PVD), a spin-on process, or jet vapor deposition (JVD), as examples, although alternatively, other methods may also be used.

The first insulating material 104a is patterned with a pattern for a propeller-shaped portion 106a, and then a conductive material is formed over the insulating material 104a to fill the pattern and form the propeller-shaped portion 106a. The propeller-shaped portion 106a is also referred to herein as a first propeller-shaped portion 106a, for example. The first propeller-shaped portion 106a may be formed using a single damascene process, for example, wherein the insulating material 106a is patterned using lithography and then portions of the insulating material 106a are then etched away. The conductive material is formed over the first insulating material 106, and excess conductive material is removed from over the top surface of the first insulating material 106a using an etch process and/or a chemical-mechanical polish (CMP) process, for example.

Alternatively, the first propeller-shaped portion 106a may be formed using a subtractive etch process, wherein the conductive material 106a is deposited or formed over the workpiece 102, and the conductive material 106a is patterned using lithography in the shape of the first propeller-shaped portion 106a. The first insulating material 104a is then formed around the first propeller-shaped portion 106a by depositing the first insulating material 104a over the first propeller-shaped portion 106a and removing any excess first insulating material 104a from over the top surface of the first propeller-shaped portion 106a, if necessary, for example.

The first insulating material 104a and the first propeller-shaped portion 106a are preferably formed in a metallization layer Mx of the semiconductor device 100. The metallization layer Mx is also referred to herein as a first metallization layer or a first conductive material layer, for example. Conductive lines, not shown, may be formed elsewhere on the semiconductor device 100 within the metallization layer Mx, for example. The conductive lines may be formed simultaneously with the formation of the first propeller-shaped portions 106a, for example. Thus, additional etch processes and lithography processes may not be required to manufacture the novel first propeller-shaped portion 106a in accordance with embodiments of the present invention. For example, the pattern for the first propeller-shaped portions 106a may be included in an existing mask level for the first metallization layer Mx.

Figure 2:
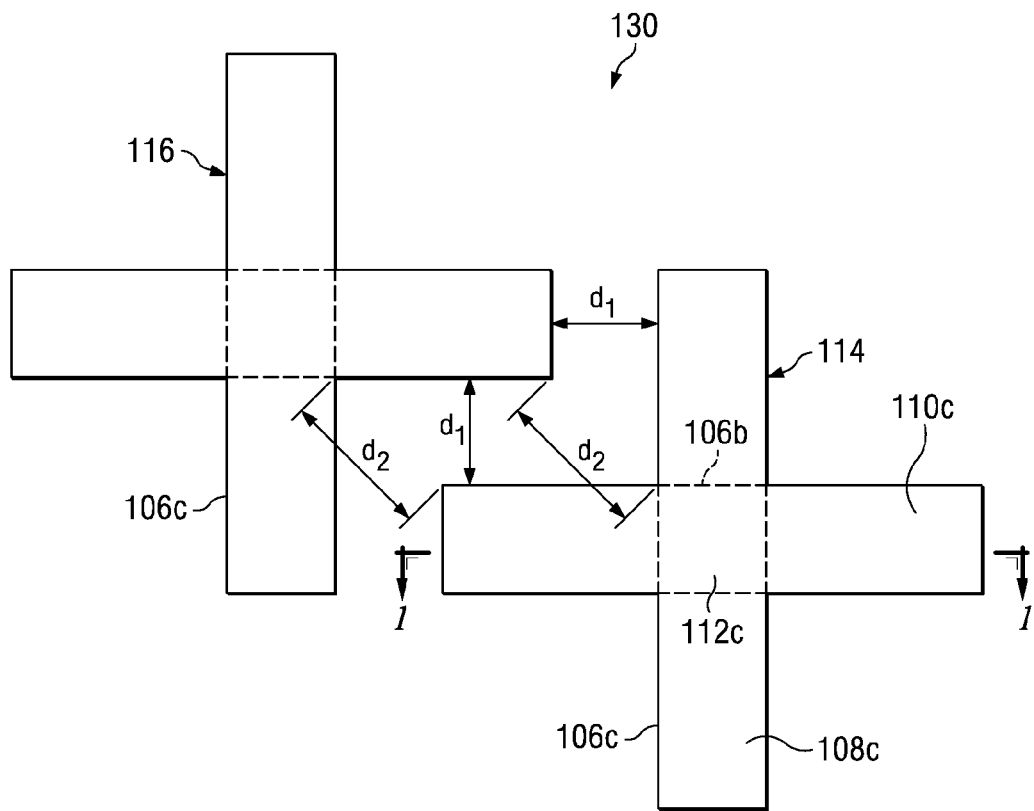
FIG. 2 shows a top view of a capacitor including two capacitor plates comprising propeller-shaped portions in accordance with a preferred embodiment of the present invention.

Only one first propeller-shaped portion 106a is shown in FIG. 1; however, in accordance with embodiments of the present invention, a plurality of first propeller-shaped portions 106a are preferably formed, e.g., simultaneously, in the metallization layer Mx (not shown; see FIG. 2).

The conductive material used to form the first propeller-shaped portion 106a preferably comprises a metal and/or a semiconductive material, for example. The conductive material preferably comprises copper, aluminum, alloys thereof, polysilicon, amorphous silicon, or combinations or multiple layers thereof, as examples. Alternatively, the conductive material used to form the first propeller-shaped portion 106a may comprise other materials.

A via portion 106b is formed in a second metallization layer Vx over the first metallization layer Mx within a second insulating material 104b, as shown in FIG. 1. The via portion 106b is also referred to herein as a first via portion, for example. The metallization layer Vx is also referred to herein as a second metallization layer or a second conductive material layer, for example. The via portion 106b may be formed using a damascene process or using a subtractive etch process, for example, as described for the formation of the first propeller-shaped portions 106a in the first metallization layer Mx.

The via portion 106b is disposed over and is coupled to the first propeller-shaped portion 106a, as shown. The via portion 106b may comprise a first end 112a and a second end 112c, wherein the first end 112a of the via portion 106b is coupled to the first propeller-shaped portion 106a, as shown. The via portion 106b may be coupled to the first propeller-shaped portion 106a in a substantially central region of the propeller-shaped portion 106a, as shown.

The second insulating material 104b may comprise similar materials and dimensions as described herein for the first insulating material 104a, for example. The second insulating material 104b is preferably adjacent the first insulating material 104a, as shown. The via portion 106b may comprise similar materials as described herein for the first propeller-shaped portion 106a, for example. Alternatively, the second insulating material 104b and the via portion 106b may comprise other materials or dimensions.

Conductive vias may be formed elsewhere on the semiconductor device 100 within the metallization layer Vx, for example, not shown. The conductive vias may be formed simultaneously with the formation of the via portion 106b, for example. Thus, additional etch processes and lithography processes may not be required to manufacture the novel via portions 106b in accordance with embodiments of the present invention. The pattern for the via portion 106b may be included in an existing mask level for the second metallization layer Vx, for example.

Only one via portion 106b is shown in FIG. 1; however, in accordance with embodiments of the present invention, a plurality of via portions 106b are preferably formed, e.g., simultaneously, in the metallization layer Vx (not shown; see FIG. 2).

A second propeller-shaped portion 106c is formed in a third metallization layer M(x+1) over the second metallization layer Vx within a third insulating material 104c, as shown in FIG. 1. The metallization layer M(x+1) is also referred to herein as a third metallization layer or a third conductive material layer, for example. The second propeller-shaped portion 106c may be formed using a damascene process or using a subtractive etch process, for example, as described for the first metallization layer Mx.

The second propeller-shaped portion 106c is disposed over and is coupled to the via portion 106b, as shown. The second propeller-shaped portion 106c may be coupled to the second end 112c of the via portion 106b, for example. The second propeller-shaped portion 106c may be coupled to the via portion 106b in a substantially central region of the second propeller-shaped portion 106c, as shown.

The third insulating material 104c may comprise similar materials and dimensions as described for the first insulating material 104a, for example. The third insulating material 104c is preferably adjacent the second insulating material 104b, as shown. The second propeller-shaped portion 106c may comprise similar materials as described for the first propeller-shaped portion 106a, for example. Alternatively, the third insulating material 104c and the second propeller-shaped portion 106c may comprise other materials or dimensions.

Conductive lines may be formed elsewhere on the semiconductor device 100 within the metallization layer M(x+1), for example, not shown. The conductive lines may be formed simultaneously with the formation of the second propeller-shaped portions 106c, for example. Thus, additional etch processes and lithography processes may not be required to manufacture the novel second propeller-shaped portion 106c in accordance with embodiments of the present invention; rather, the second propeller-shaped portion 106c pattern may be included in an existing mask level for the metallization layer M(x+1), for example.

Only one second propeller-shaped portion 106c is shown in FIG. 1; however, in accordance with embodiments of the present invention, a plurality of second propeller-shaped portions 106c are preferably formed, e.g., simultaneously, in the metallization layer M(x+1) (not shown; see FIG. 2).

In a preferred embodiment, the second propeller-shaped portion 106c and the via portion 106b are simultaneously formed using a dual damascene process. For example, the second insulating material 104b and the third insulating material 104c may be deposited over the first metallization layer Mx, and two lithography masks and etch processes are used to form patterns in the second insulating material 104b and the third insulating material 104c for the via portion 106b and the second propeller-shaped portion 106c, respectively, for example. The patterns for the via portion 106b and the second propeller-shaped portion 106c are then simultaneously filled with a conductive material using one deposition step, and excess conductive material is removed using an etch process and/or CMP process, leaving the via portion 106b and the second propeller-shaped portion 106c formed within the second insulating material 104b and the third insulating material 104c, respectively.

The metallization or conductive material layers Mx, Vx, and/or M(x+1) may comprise conductive material layers disposed at various locations of a semiconductor device 100. For example, layer Mx may comprise a first metallization layer, e.g., the first layer formed in a back-end-of the line (BEOL) process. Or, layer Mx may comprise a second or greater metallization layer, disposed above and over previously formed metallization layers. Alternatively, layers Mx, Vx, and/or M(x+1) may comprise conductive material layers formed in a front-end-of the line (FEOL) process, for example.

The first propeller-shaped portion 106a, the via portion 106b, and the second propeller-shaped portion 106c form a capacitor plate (e.g., plates 114 and 116 shown in a top view in FIG. 2) of a capacitor 130 in accordance with embodiments of the present invention. Two capacitor plates 114 and 116 may be formed proximate one another within the insulating materials 104a, 104b, and 104c, forming a capacitor 130, in accordance with embodiments of the present invention. Portions of the insulating materials 104a, 104b, and 104c function as a capacitor dielectric in these embodiments. Two or more capacitor plates 114 and/or 116 may be coupled together to form a single capacitor plate, to be described further herein.

FIG. 2 shows a top view of a capacitor 130 including two capacitor plates 114 and 116 comprising propeller-shaped portions 106c (and also 106a, not shown) in accordance with a preferred embodiment of the present invention. The second propeller-shaped portions 106c are shown in the top view of FIG. 2; however, the first propeller-shaped portions are not shown in FIG. 2 (refer again to FIG. 1), for example. The via portions 106b are shown in phantom in FIG. 2.

In accordance with a preferred embodiment of the present invention, the second propeller-shaped portions 106c of the capacitor plates 114 and 116 (and also the first propeller-shaped portions 106a) preferably comprise members 108c and 110c having widths that substantially comprise a minimum feature size of the semiconductor device 100, for example. The second propeller-shaped portions 106c (and also the first propeller-shaped portions 106c) of the capacitor plates 114 and 116 are also preferably spaced apart by a dimension $d_1$ that is substantially equal to the minimum feature size of the semiconductor device 100, for example. The via portions 106b, shown in phantom, may also comprise a minimum feature size of the semiconductor device 100, for example. The members 108c and 110c are also referred to herein as blades, for example.

The capacitor plates 114 and 116 may comprise a first capacitor plate 116 and a second capacitor plate 114 of a capacitor 130. The first propeller-shaped portion 106a or the second propeller-shaped portion 106c of the first capacitor plate 116 may comprise an inner corner, e.g., where the vertical and horizontal members 108c and 110c intersect. The first propeller-shaped portion 106a or the second propeller-shaped portion 106c of the second capacitor plate 114 may comprise an outer corner, e.g., at an outer corner of an edge of a blade or member 108c or 110c. The inner corner of the first propeller-shaped portion 106a or the second propeller-shaped portion 106c of the first capacitor plate 116 is preferably spaced apart from the first propeller-shaped portion 106a or the second propeller-shaped portion 106c of the second capacitor plate 114 by a dimension $d_2$ of about 1.4 times the minimum feature size of the semiconductor device 100 in some embodiments, for example. Dimension $d_2$ represents the space between a via portion 106b and an adjacent first or second propeller-shaped portion 106a or 106c, for example.

The propeller-shaped portions 106a and 106c of capacitor plates 114 and 116 in accordance with embodiments of the present invention preferably comprise a horizontally-extending member and a vertically-extending member, the vertically-extending member being substantially orthogonal to and coupled to the horizontally-extending member. The horizontally-extending member and the vertically-extending member intersect, as shown. The first propeller-shaped portion 106a (see FIG. 1) may comprise a first member that is horizontally oriented in a top view, and a second member that is vertically oriented in a top view, wherein the first member is substantially orthogonal to and coupled to the second member, not shown. The first member and the second member may intersect proximate a substantially central region of the first member and the second member. Likewise, the second propeller-shaped portion 106c may comprise a third member and a fourth member that is orthogonal to the third member.

For example, in the top view shown FIG. 2, the second propeller-shaped portion 106c comprises a third member 108c and a fourth member 110c, the fourth member 110c being substantially orthogonal to and coupled to the third member 108c. The third member 108c and the fourth member 110c intersect proximate a substantially central region of the third member 108c and the fourth member 110c. The via portion 106b is preferably coupled to the second propeller-shaped portion 106c at the second end 112c of the via portion 106b, as shown in phantom.

The members 108c and 110c preferably comprise the same length in accordance with some embodiments of the present invention. For example, member 108c may comprise a first length, and member 110c may comprise a second length, the second length being substantially the same as the first length.

Figure 7:
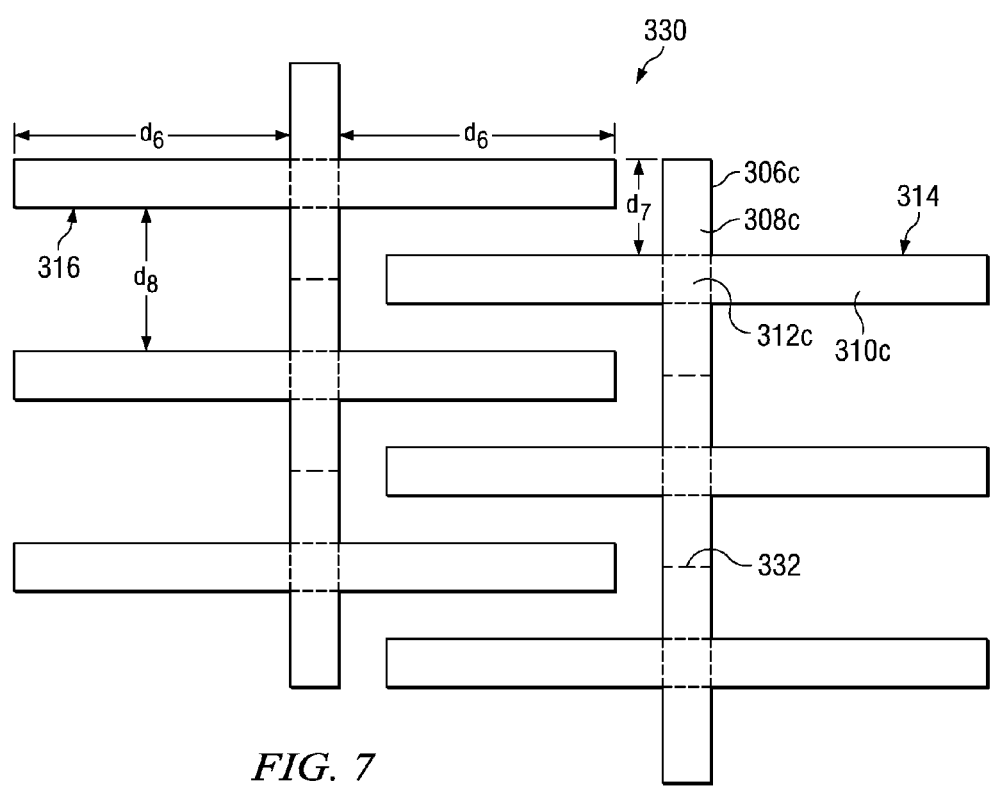
FIG. 7 shows yet another embodiment of the present invention, wherein two blades of the propeller-shaped portion of the capacitor plate are elongated, and wherein the blades of two adjacent capacitor plates are coupled together.
Figure 6:
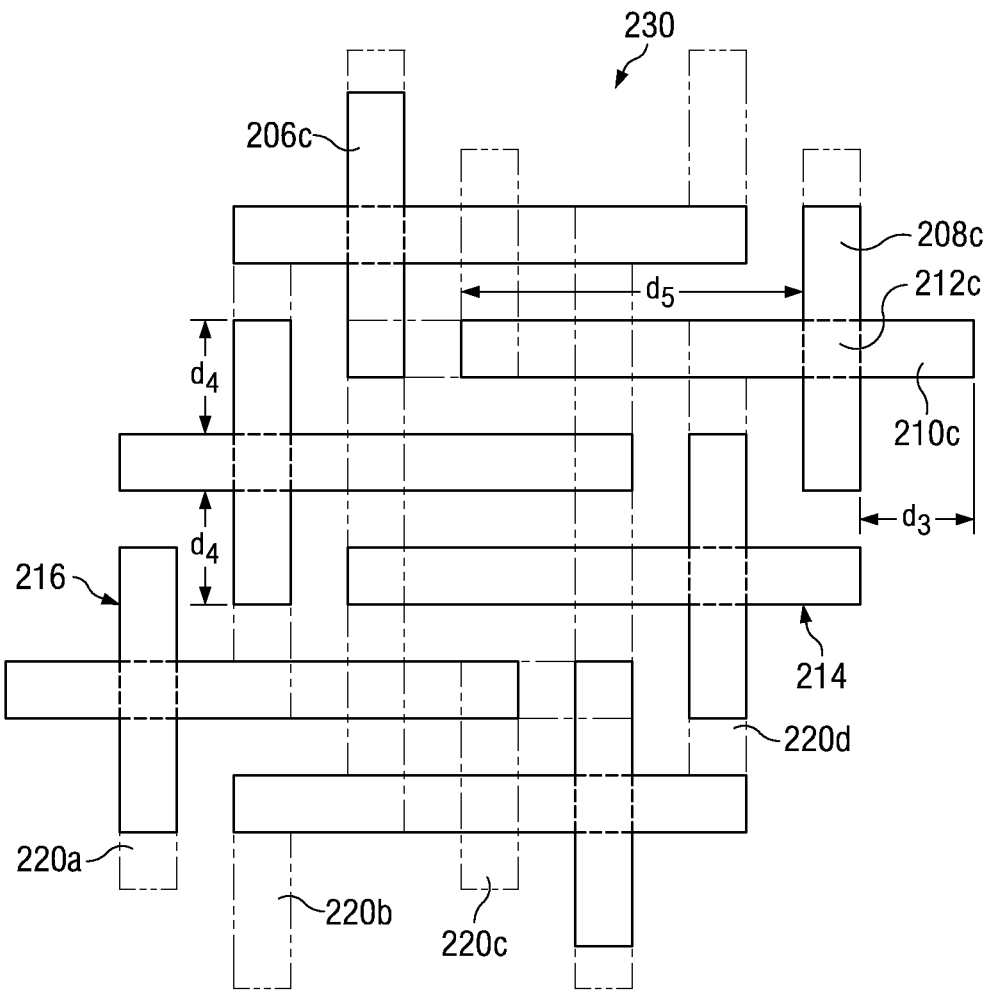
FIG. 6 shows another embodiment of the present invention, wherein one blade of a propeller-shaped portion of a capacitor plate is elongated and extends proximate an elongated blade of a propeller-shaped portion of an adjacent capacitor plate.

In other embodiments, the members 108c and 110c comprise different lengths, to be described further herein with respect to the embodiments shown in FIGS. 6 and 7. For example, the second length of member 110c may be different than the first length of member 108a.

The first propeller-shaped portion 106a or the second propeller-shaped portion 106c preferably comprises a plurality of blades. In a preferred embodiment, the first propeller-shaped portion 106a or the second propeller-shaped portion 106c preferably comprises three or more blades. In other embodiments, the first propeller-shaped portion 106a or the second propeller-shaped portion 106c preferably comprises exactly four blades, as shown in the top view of FIG. 2, for example. Each member 108c and 110c may comprise two blades, for example. In yet other embodiments, the first propeller-shaped portion 106a or the second propeller-shaped portion 106c preferably comprises the shape of a cross, the letter "X," or the letter "T," as examples, although alternatively, other shapes may also be used. The first propeller-shaped portion 106a or the second propeller-shaped portion 106c may also comprise five, six, or more blades, as examples.

Preferably, in some embodiments, the first propeller-shaped portion 106a or the second propeller-shaped portion 106c preferably comprises a shape that improves a CMP process for the conductive material layer Mx or M(x+1) that the propeller-shaped portions 106a or 106c are formed in, for example. The first propeller-shaped portion 106a or the second propeller-shaped portion 106c preferably comprise similar sizes and dimensions as other conductive features formed in the same conductive material layer, for example, in these embodiments.

The first propeller-shaped portion 106a and the second propeller-shaped portion 106c may comprise the same shape and dimension for a single capacitor plate 114 or 116, for example. Alternatively, the first propeller-shaped portion 106a and the second propeller-shaped portion 106c may comprise different shapes and dimensions for a single capacitor plate 114 or 116, for example. The first propeller-shaped portion 106a and the second propeller-shaped portion 106c may comprise the same or different shapes and dimensions for various capacitor plates 114 or 116 of a single capacitor 130 or across the surface of a semiconductor device 100, for example.

Figure 3:
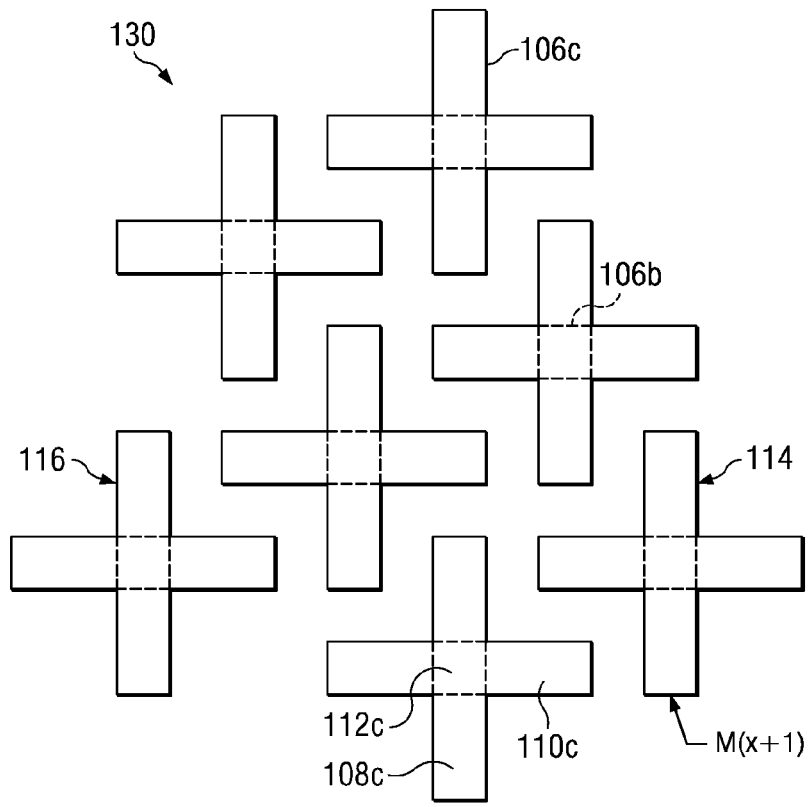
FIG. 3 shows a top view of a plurality of capacitor plates in accordance with a preferred embodiment of the present invention.

FIG. 3 shows a top view of a plurality of capacitor plates 114 and 116 of capacitors 130 in accordance with a preferred embodiment of the present invention. In some embodiments, an array of capacitor plates 114 and 116 comprising the second propeller-shaped portions 106c, via portions 106b, and also the first propeller-shaped portions 106a, not shown, are preferably formed across a portion of a semiconductor workpiece 102, for example. The second propeller-shaped portions 106c may be staggered and the blades interwoven and spaced apart to achieve a desired capacitance and to achieve a more efficient use of space, for example. The arrangement of the second propeller-shaped portions 106c shown is merely shown as an example; the second propeller-shaped portions 106c may be arranged in other shapes and patterns, for example.

Figure 4:
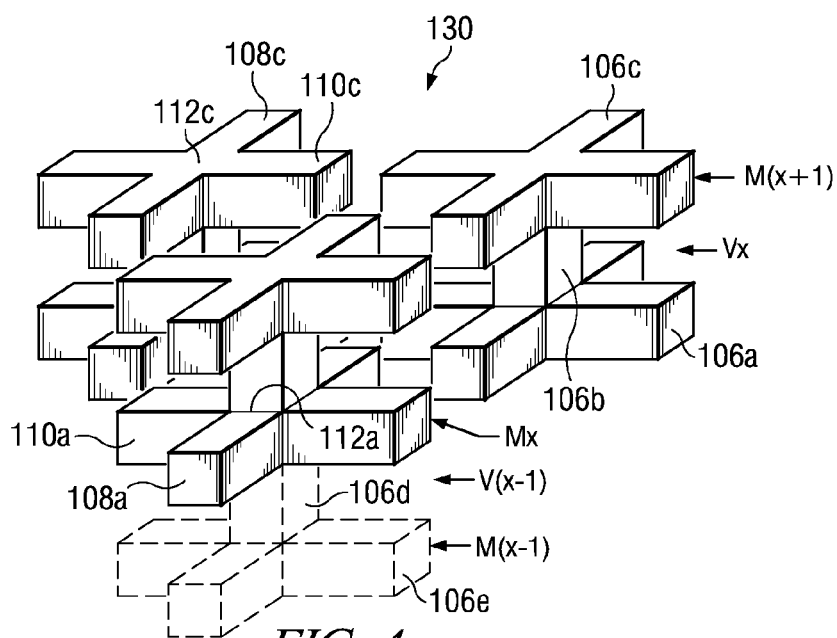
FIG. 4 shows a perspective view of capacitor plates in accordance with embodiments of the present invention.

FIG. 4 shows a perspective view of capacitor plates of capacitors 130 in accordance with embodiments of the present invention. The capacitors 130 may include three or more propeller-shaped portions 106a, 106c, and 106e, as shown in phantom. For example, a second via portion 106d may be coupled to the first propeller-shaped portion 106a, and a third propeller-shaped portion 106e may be coupled to the second via portion 106d. The second via portion 106d may be formed in a conductive material layer V(x−1), and the propeller-shaped portion 106e may be formed in a conductive material layer M(x−1), for example. Additional via portions and propeller-shaped portions may be coupled to and disposed above and/or below propeller-shaped portions 106c and 106e, not shown.

For example, the via portion 106b comprises a first via portion 106b, and the capacitor plates further comprise a second via portion 106d disposed within a fourth insulating material of the semiconductor device 100, the fourth insulating material being adjacent the insulating material that the first propeller-shaped portions 106a are formed in. The third propeller-shaped portion 106e is disposed in a fifth insulating material of the semiconductor device 100, the fifth insulating material being adjacent the fourth insulating material. The second via portion 106d is disposed between the first propeller-shaped portion 106a and the third propeller-shaped portion 106e, as shown. Additional via portions and propeller-shaped portions may be disposed above the second propeller shaped portions 106c, for example, in additional insulating material layers, not shown.

Thus, capacitor plates of capacitors 130 may comprise a plurality of propeller-shaped portions 106a, 106c, and 106e coupled together by a plurality of via portions 106b and 106c in accordance with embodiments of the present invention, for example. The propeller-shaped portions 106a, 106c, and 106e and the via portions 106b and 106c may be formed in multiple conductive material layers, or in every conductive material layer of a semiconductor device 100, for example.

Figure 5:
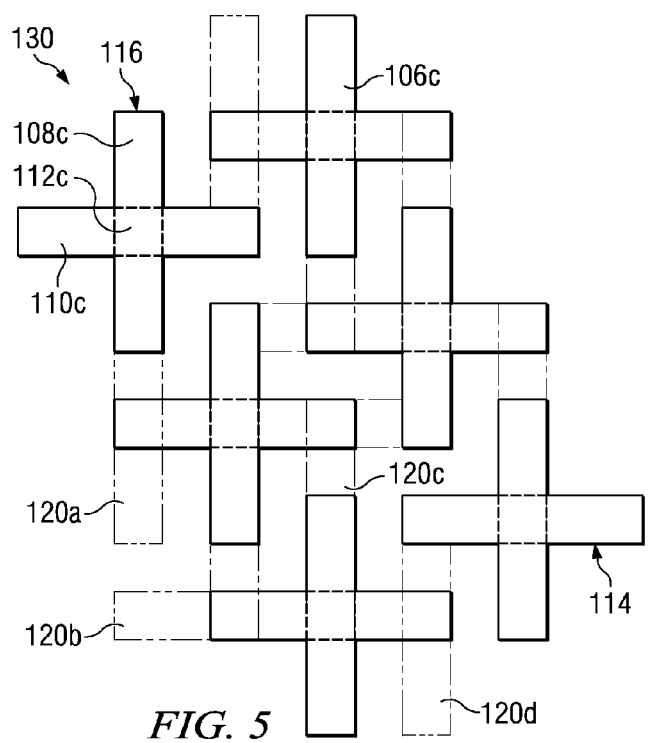
FIG. 5 shows a top view of another preferred embodiment of the present invention, wherein two or more capacitor plates are electrically coupled together using a conductive material layer of the semiconductor device disposed above or below the capacitor plates.

FIG. 5 shows a top view of another preferred embodiment of the present invention, wherein two or more capacitor plates 114 or 116 are electrically coupled together using a conductive material layer of the semiconductor device disposed above or below the capacitor plates 114 and 116. Conductive lines 120a, 120b, 120c, and 120d may be formed in the conductive material layer, as shown in phantom. Two or more capacitor plates 114 or 116 may be coupled together by a conductive line 120a, 120b, 120c, and 120d in a conductive material layer adjacent the first conductive material layer Mx or the third conductive material layer M(x+1) shown in FIG. 1, for example. The conductive lines 120a, 120b, 120c, and 120d may be coupled to the second propeller-shaped portions 106c (or to the first propeller-shaped portions 106a disposed below the propeller-shaped portions 106c, not shown in FIG. 5) using vias, also not shown. The vias may be coupled proximate via portions 106b, for example, or the vias connecting the conductive lines 120a, 120b, 120c, and 120d may be coupled along the members 108c and/or 110c, as another example, not shown.

FIG. 6 shows another embodiment of the present invention, wherein one blade of a propeller of a capacitor plate 214 is elongated and extends proximate an elongated blade of a propeller of an adjacent capacitor plate 216 Like numerals are used for the various elements in FIG. 6 that were used to describe FIGS. 1 through 5. To avoid repetition, each reference number shown in FIG. 6 is not described again in detail herein. Rather, similar materials x06, x08, x10, etc . . . are preferably used to describe the various material layers shown as were used to describe FIGS. 1 through 5, where x=1 in FIGS. 1 through 5 and x=2 in FIG. 6. As an example, the preferred and alternative materials and dimensions described for the second propeller-shaped portions 106c in the description for FIGS. 1 through 5 are preferably also used for the second propeller-shaped portions 206c shown in FIG. 6.

In the embodiment shown in FIG. 6, each second propeller-shaped portion 206c has one blade that is longer than the other blades. Each second propeller-shaped portion 206c comprises two blades extending in a vertical direction having a dimension $d_4$. Each second propeller-shaped portion 206c comprises two blades extending in a horizontal direction having dimensions $d_3$ and $d_5$, wherein dimension $d_5$ is preferably greater than dimension $d_3$ and $d_4$. Dimensions $d_3$ and $d_4$ may be substantially the same, for example. Dimension $d_5$ is preferably about three times or more greater than dimension $d_3$ and $d_4$, for example.

The longer blades having dimension $d_5$ are preferably interwoven for adjacent second propeller-shaped portions 206c, as shown, for example. The second propeller-shaped portions 206c may also be staggered, as shown. Adjacent second propeller-shaped portions 206c are preferably interwoven in a comb-like fashion to achieve a particular desired capacitance, for example. The dimensions of the blades and type of dielectric material (e.g., of insulating materials 104a, 104b, and 104c shown in FIG. 1) are preferably also selected to achieve a desired capacitance for the capacitor 230, for example. Multiple capacitor plates 214 and 216 may be coupled together using conductive lines 220a, 220b, 220c, and 220d in a conductive material layer proximate the second propeller-shaped portions 206c (or proximate first propeller-shaped portions disposed beneath the second propeller-shaped portions 206d, not shown).

FIG. 7 shows yet another preferred embodiment of the present invention, wherein two blades of the propeller-shaped portions 306c of the capacitor plates 314 and 316 are elongated, and wherein the blades of two adjacent capacitor plates 314 or 316 are coupled together, e.g., at the ends 332. Again, like numerals are used for the various elements that were used to describe the previous figures, and to avoid repetition, each reference number shown in FIG. 7 is not described again in detail herein.

The capacitor plates 314 and 316 are preferably cross-shaped in this embodiment. The cross-shape structure may be symmetric as shown, or asymmetric.

The ends 332 of blades of adjacent propeller-shaped portions 306c in this embodiment are preferably coupled together or attached, providing electrical connection between adjacent propeller-shaped portions 306c, for example. This embodiment is advantageous because an additional conductive material layer is not required to be used to couple together the capacitor plates 314 or 316; e.g., conductive lines 120a, 120b, 120c, 120d and 220a, 220b, 220c, and 220d shown in phantom in FIGS. 5 and 6, respectively, are not required. Longer blades of the propeller-shaped portions 306c may have a dimension $d_6$, and shorter blades have a dimension $d_7$, wherein the longer blades are preferably about three times or greater longer than the shorter blades, for example. The longer blades of the propeller-shaped portions 306c may be spaced apart by a dimension $d_8$, wherein dimension $d_8$, is about equal to twice the dimension $d_7$, for example.

Connecting the ends 332 of the blades together may be advantageous in some embodiments, because the plates 314 and 316 may be connected to form a single electrical potential, maximizing the efficiency of the available surface area, as well as providing an excellent dummy filler for global planarization processes, for example.

Figure 8:
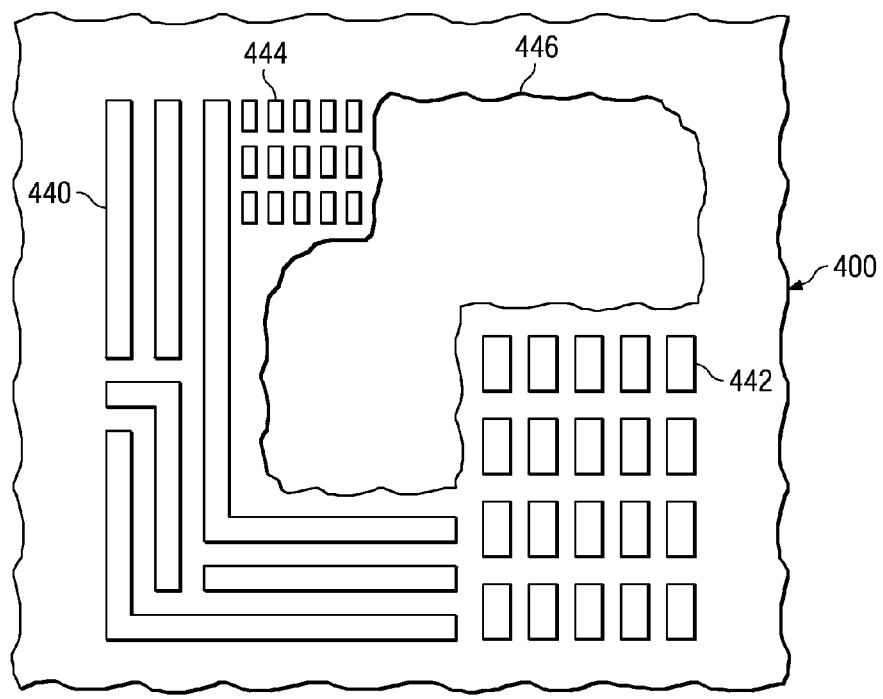
FIGS. 8 and 9 show top views of a semiconductor device in accordance with a preferred embodiment, wherein the novel capacitor plates described herein are formed in unused or dedicated regions of a semiconductor device.
Figure 9:
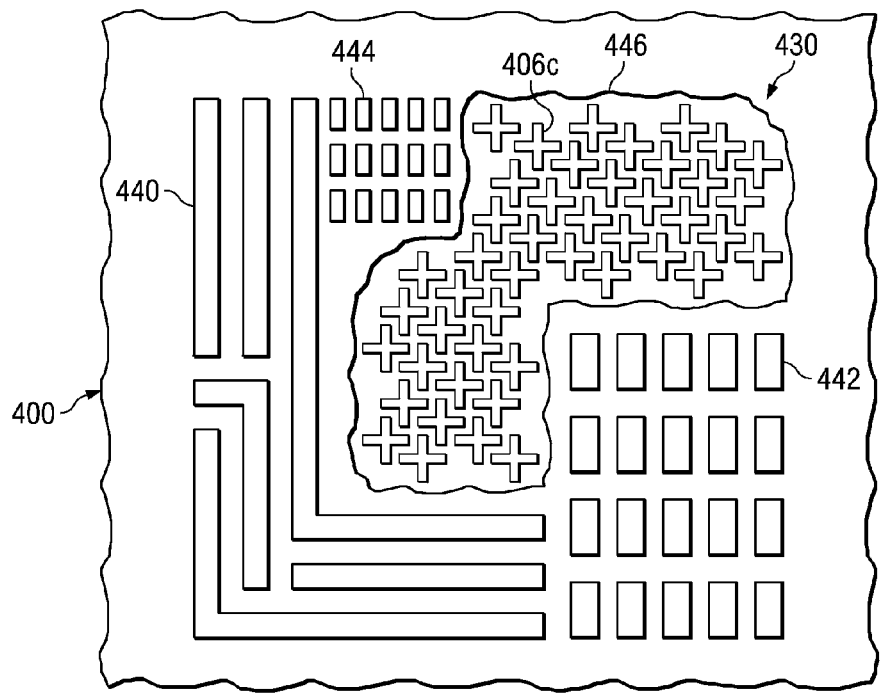

FIGS. 8 and 9 show top views of a semiconductor device 400 in accordance with a preferred embodiment of the present invention. Again, like numerals are used for the various elements that were used to describe the previous figures, and to avoid repetition, each reference number shown in FIGS. 8 and 9 are not described again in detail herein.

A top view of a material layer is shown in FIG. 8 that includes conductive lines 440 and a plurality of features 442 and 444 comprising various sizes, wherein an unused region 446 of the semiconductor device 400 is absent conductive lines 440 and features 442 and 444. The novel capacitors 430 described herein may be formed in the unused region 446 of the semiconductor device, as shown in FIG. 9. Thus, in accordance with some embodiments of the present invention, capacitor plates comprising propeller-shaped portions may be formed in unused regions of a semiconductor device 400, to efficiently use the surface area of the semiconductor device 400.

Alternatively, the capacitor plates described herein may be formed in a dedicated region of the semiconductor device 400, wherein the region the capacitor plates are formed in is dedicated particularly for the formation of the capacitors 130, 230, 330, and 430 described herein, for example.

After the top-most material layer comprising propeller-shaped portions 106c, 206c, 306c, and 406c of the capacitors 130, 230, 330, and 430 is fabricated, the manufacturing process for the semiconductor devices 100, 200, 300, and 400 is then continued to complete the fabrication of the semiconductor devices. For example, additional insulating material layers and conductive material layers may be formed over the novel capacitors 130, 230, 330, and 430 and may be used to interconnect the various components of the semiconductor devices 100, 200, 300, and 400.

In the drawings, the ends of the propeller-shaped portions 106a, 106c, 206c, 306c, and 406c are shown as being substantially square; alternatively, due to the lithography processes used to pattern the propeller-shaped portions 106a, 106c, 206c, 306c, and 406c, the ends of the propeller-shaped portions 106a, 106c, 206c, 306c, and 406c may also be rounded, for example, not shown.

Embodiments of the present invention include semiconductor devices 100, 200, 300, and 400 and capacitors 130, 230, 330, and 430 having propeller-shaped portions 106a, 106c, 206c, 306c, and 406c as capacitor plates 114, 116, 214, 216, 314, and 316. Embodiments of the present invention also include methods of fabricating the semiconductor devices 100, 200, 300, and 400 and capacitor plates 114, 116, 214, 216, 314, and 316, and capacitors 130, 230, 330, and 430 described herein, for example.

The novel capacitor plates 114, 116, 214, 216, 314, and 316 comprise three-dimensional structures that are formed in multiple conductive material layers Mx, Vx, and M(x+1) of a semiconductor device 100, 200, 300, and 400. The propeller-shaped portions 106a, 106c, 206c, 306c, and 406c coupled together by via portions 106b and 206b provide a novel capacitor plate 114, 116, 214, 216, 314, and 316 shape that provides flexibility in the placement and shaping of capacitors 130, 230, 330, and 430 of semiconductor devices 100, 200, 300, and 400. In some embodiments, the propeller-shaped portions 106a, 106c, 206c, 306c, and 406c are preferably ground-rule based, comprising a width of a minimum feature size of a semiconductor device 100, 200, 300, and 400, achieving a higher capacitance value, for example.

The capacitor plates 114, 116, 214, 216, 314, and 316 described herein may be placed in series or in parallel. For example, placing the capacitor plates 114, 116, 214, 216, 314, and 316 in series reduces the overall capacitance of the capacitors 130, 230, 330, and 430 comprised of the capacitor plates 114, 116, 214, 216, 314, and 316. Placing the capacitor plates 114, 116, 214, 216, 314, and 316 in parallel increases the overall capacitance of the capacitors 130, 230, 330, and 430 comprised of the capacitor plates 114, 116, 214, 216, 314, and 316.

Advantages of embodiments of the present invention include providing improved methods of utilizing space in semiconductor devices 100, 200, 300, and 400 by fabricating capacitors 130, 230, 330, and 430 in electrically unused areas of metallization layers. A plurality of the capacitors 130, 230, 330, and 430 may be arranged in an array and may be accessed using addressing, for example. The capacitors 130, 230, 330, and 430 may be electrically connected to functional regions of the semiconductor device 100, 200, 300, or 400 or may be used as spare capacitors 130, 230, 330, and 430, providing redundancy in an integrated circuit.

In some embodiments, the propeller-shaped portions 106a, 106c, 206c, 306c, and 406c of the capacitors 130, 230, 330, and 430 have substantially the same or similar dimensions as other interconnect features or devices such as conductive lines 440 and devices 442 and 444, so that the capacitors 130, 230, 330, and 430 are easily integratable into existing semiconductor device structures and manufacturing process flows. The capacitors 130, 230, 330, and 430 may be used as dummy or functional fill structures to improve CMP processes used to planarize a conductive material layer, for example. The novel capacitors 130, 230, 330, and 430 are small, fast, and low in complexity and cost. The properties of the capacitors 130, 230, 330, and 430 may be tuned by adjusting the capacitor 130, 230, 330, and 430 dielectric thickness and materials, and by array arrangement, as examples.

The novel capacitors 130, 230, 330, and 430 may function as spare capacitors 130, 230, 330, and 430 in an integrated circuit design, providing redundancy in the design.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A capacitor comprising:
a first propeller-shaped portion disposed in a first metal level, wherein the first propeller-shaped portion comprises a first horizontal member oriented in a first direction and a first vertical member oriented in a second direction, the first horizontal member having a first horizontal length in the first direction and the first vertical member having a first vertical length in the second direction, the first vertical member intersecting the first horizontal member in a first intersection region having a first center point, the first direction being orthogonal to the second direction, wherein the first horizontal length is greater than the first vertical length;
a second propeller-shaped portion disposed in the first metal level, wherein the second propeller-shaped portion comprises a second horizontal member oriented in the first direction and a second vertical member oriented in the second direction, the second vertical member intersecting the second horizontal member in a second intersection region having a second center point;
a third propeller-shaped portion disposed in the first metal level, wherein the third propeller-shaped portion comprises a third horizontal member oriented in the first direction and a third vertical member oriented in the second direction, the third vertical member intersecting the third horizontal member in a third intersection region having a third center point; and
a fourth propeller-shaped portion disposed in the first metal level, wherein the fourth propeller-shaped portion comprises a fourth horizontal member oriented in the first direction and a fourth vertical member oriented in the second direction, the fourth vertical member intersecting the fourth horizontal member in a fourth intersection region having a fourth center point, wherein the first horizontal member overlaps with the second vertical member, the third horizontal member, the fourth vertical member, and the fourth horizontal member so as to prevent any other additional vertical member to intersect with the first horizontal member in the first metal level.

2. The capacitor according to claim 1, wherein the second horizontal member has a second horizontal length in the first direction and the second vertical member has a second vertical length in the second direction, wherein the third horizontal member has a third horizontal length in the first direction and the third vertical member has a third vertical length in the second direction, wherein the fourth horizontal member has a fourth horizontal length in the first direction and the fourth vertical member has a fourth vertical length in the second direction, wherein the second horizontal length is greater than the second vertical length, wherein the third horizontal length is greater than the third vertical length, and wherein the fourth horizontal length is greater than the fourth vertical length.

3. The capacitor according to claim 1, wherein the first intersection region is asymmetrically located along the first horizontal member.

4. The capacitor according to claim 1, wherein the second intersection region is asymmetrically located along the second horizontal member, wherein the third intersection region is asymmetrically located along the third horizontal member, and wherein the fourth intersection region is asymmetrically located along the fourth horizontal member.

5. The capacitor according to claim 4, wherein the second intersection region is symmetrically located along the second vertical member, wherein the third intersection region is symmetrically located along the third vertical member, and wherein the fourth intersection region is symmetrically located along the fourth vertical member.

6. The capacitor according to claim 1, wherein a length of the first horizontal member along the first direction from the first center point to a first edge of the first horizontal member is at least three times greater than a length of the first horizontal member along the first direction from the first center point to an opposite second edge of the first horizontal member.

7. The capacitor according to claim 1, wherein a length of the first horizontal member along the first direction from the first center point to a first edge of the first horizontal member is at least three times greater than a length of the first vertical member along the second direction from the first center point to an edge of the first vertical member.

8. The capacitor according to claim 7, wherein a length of the first horizontal member along the first direction from the first center point to an opposite second edge of the first horizontal member is about the same as a length of the first vertical member along the second direction from the first center point to an edge of the first vertical member.

9. The capacitor according to claim 1, wherein a length of the first horizontal member along the first direction from the first center point to a first edge of the first horizontal member is greater than a length of the first horizontal member along the first direction from the first center point to an opposite second edge of the first horizontal member.

10. The capacitor according to claim 9, wherein a length of the second horizontal member along the first direction from the second center point to a first edge of the second horizontal member is greater than a length of the second horizontal member along the first direction from the second center point to an opposite second edge of the second horizontal member.

11. A capacitor comprising:
a first four blade propeller-shaped portion comprising a first horizontal member oriented in a first direction and a first vertical member oriented in a second direction, the first horizontal member and the first vertical member intersecting at a first intersection region having a first center point, the first horizontal member having a first horizontal length in the first direction and the first vertical member having a first vertical length in the second direction, wherein the first horizontal length is greater than the first vertical length, wherein a length of the first horizontal member along the first direction from the first center point to a first edge of the first horizontal member is greater than a length of the first horizontal member along the first direction from the first center point to an opposite second edge of the first horizontal member, wherein the first four blade propeller-shaped portion is surrounded by a second four blade propeller-shaped portion, a third four blade propeller-shaped portion, and a fourth four blade propeller-shaped portion such that the first horizontal member is intersected by no other vertical member oriented along the second direction other than the first vertical member.

12. The capacitor according to claim 11, wherein the first intersection region is symmetrically located along the first vertical member.

13. The capacitor according to claim 11, wherein a length of the first horizontal member along the first direction from the first center point to a first edge of the first horizontal member is at least three times greater than a length of the first horizontal member along the first direction from the first center point to an opposite second edge of the first horizontal member.

14. The capacitor according to claim 11, wherein a length of the first horizontal member along the first direction from the first center point to a first edge of the first horizontal member is at least three times greater than a length of the first vertical member along the second direction from the first center point to an edge of the first vertical member.

15. The capacitor according to claim 14, wherein a length of the first horizontal member along the first direction from the first center point to an opposite second edge of the first horizontal member is about the same as a length of the first vertical member along the second direction from the first center point to an edge of the first vertical member.

16. The capacitor according to claim 14,
wherein the second four blade propeller-shaped portion comprising a second horizontal member oriented in the first direction and a second vertical member oriented in the second direction, the second horizontal member and the second vertical member intersecting at a second intersection region having a second center point, the second horizontal member having a second horizontal length in the first direction and the second vertical member having a second vertical length in the second direction, wherein the second horizontal length is greater than the second vertical length, wherein a length of the second horizontal member along the first direction from the second center point to a first edge of the second horizontal member is greater than a length of the second horizontal member along the first direction from the second center point to an opposite second edge of the second horizontal member.

17. The capacitor according to claim 16, wherein the first intersection region is symmetrically located along the first vertical member, and wherein the second intersection region is symmetrically located along the second vertical member.

18. A method of forming a capacitor, the method comprising:
forming a first propeller-shaped portion in a first metal level, wherein the first propeller-shaped portion comprises a first horizontal member oriented in a first direction and a first vertical member oriented in a second direction, the first horizontal member having a first horizontal length in the first direction and the first vertical member having a first vertical length in the second direction, the first vertical member intersecting the first horizontal member in a first intersection region having a first center point, the first direction being orthogonal to the second direction, wherein the first horizontal length is greater than the first vertical length;

forming a second propeller-shaped portion in the first metal level, wherein the second propeller-shaped portion comprises a second horizontal member oriented in the first direction and a second vertical member oriented in the second direction, the second vertical member intersecting the second horizontal member in a second intersection region having a second center point;

forming a third propeller-shaped portion in the first metal level, wherein the third propeller-shaped portion comprises a third horizontal member oriented in the first direction and a third vertical member oriented in the second direction, the third vertical member intersecting the third horizontal member in a third intersection region having a third center point; and forming a fourth propeller-shaped portion in the first metal level, wherein the fourth propeller-shaped portion comprises a fourth horizontal member oriented in the first direction and a fourth vertical member oriented in the second direction, the fourth vertical member intersecting the fourth horizontal member in a fourth intersection region having a fourth center point, wherein the first horizontal member overlaps with the second vertical member, the third horizontal member, the fourth vertical member, and the fourth horizontal member so as to prevent any other additional vertical member to intersect with the first horizontal member in the first metal level.

19. The method according to claim 18, wherein a length of the first horizontal member along the first direction from the first center point to a first edge of the first horizontal member is greater than a length of the first horizontal member along the first direction from the first center point to an opposite second edge of the first horizontal member.

* * * * *